United States Patent
Shang

(10) Patent No.: US 7,409,658 B2
(45) Date of Patent: Aug. 5, 2008

(54) METHODS AND SYSTEMS FOR MIXED-MODE PHYSICAL SYNTHESIS IN ELECTRONIC DESIGN AUTOMATION

(75) Inventor: Zhong-Qing Shang, Cupertino, CA (US)

(73) Assignee: Magma Design Automation, Inc., San Jose, CA (US)

( * ) Notice: Subject to any disclaimer, the term of this patent is extended or adjusted under 35 U.S.C. 154(b) by 0 days.

(21) Appl. No.: 11/140,914

(22) Filed: Jun. 1, 2005

(65) Prior Publication Data

US 2005/0268267 A1  Dec. 1, 2005

Related U.S. Application Data

(60) Provisional application No. 60/575,420, filed on Jun. 1, 2004.

(51) Int. Cl.
*G06F 17/50* (2006.01)

(52) U.S. Cl. ................ 716/8; 716/1; 716/2; 716/9; 716/18

(58) Field of Classification Search ........... 716/9, 716/2, 6, 7, 8, 1, 18
See application file for complete search history.

(56) References Cited

U.S. PATENT DOCUMENTS

| | | | |
|---|---|---|---|
| 5,566,078 A * | 10/1996 | Ding et al. | 716/8 |
| 6,415,426 B1 * | 7/2002 | Chang et al. | 716/9 |
| 6,588,003 B1 * | 7/2003 | Tetelbaum | 716/10 |
| 6,651,235 B2 * | 11/2003 | Dai et al. | 716/7 |
| 2002/0059553 A1 * | 5/2002 | Eng | 716/4 |
| 2002/0087940 A1 * | 7/2002 | Greidinger et al. | 716/2 |
| 2003/0115564 A1 * | 6/2003 | Chang et al. | 716/8 |
| 2004/0103377 A1 * | 5/2004 | Eaton et al. | 716/1 |
| 2004/0205683 A1 * | 10/2004 | Kovacs-Birkas et al. | 716/6 |
| 2004/0210857 A1 * | 10/2004 | Srinivasan | 716/2 |
| 2005/0091625 A1 * | 4/2005 | Andreev et al. | 716/8 |
| 2005/0138590 A1 * | 6/2005 | Amundson et al. | 716/11 |
| 2006/0053396 A1 * | 3/2006 | Eng | 716/7 |

\* cited by examiner

*Primary Examiner*—Jack Chiang
*Assistant Examiner*—Suchin Parihar
(74) *Attorney, Agent, or Firm*—Sterne, Kessler, Goldstein & Fox, P.L.L.C.

(57) ABSTRACT

Methods and systems for electronic design automation includes clustering objects into more manageable numbers of objects. Clustering is optionally performed to reduce or minimize interconnections between clusters. Clustering optionally includes multi-level clustering. The clusters, and any unclustered objects, are floorplanned. Floorplanning positions the clusters so as to reduce or minimize the length of interconnections between the clusters. Objects within the clusters are then placed within the area assigned to the corresponding clusters. Placement optionally utilizes placement-based wire load models to accurately predict timing issues. A bottoms-up procedure is optionally performed during clustering and/or floorplanning, whereby area and/or size constraints of clustered objects are taken into account.

20 Claims, 4 Drawing Sheets

METHODS AND SYSTEMS FOR MIXED-MODE PHYSICAL SYNTHESIS IN ELECTRONIC DESIGN AUTOMATION

CROSS-REFERENCE TO RELATED APPLICATIONS

The present invention claims the benefit of U.S. Provisional Application No. 60/575,420, filed Jun. 1, 2004, which is hereby incorporated by reference in its entirety.

BACKGROUND OF THE INVENTION

1. Field of the Invention

The invention relates to electronic design automation and, more particularly, to mixed-mode physical synthesis.

2. Related Art

Integrated circuits are designed using computer-based hardware description languages ("HDLs"), which are analogous to computer program source code. Electronic design automation ("EDA") tools are used to reduce the HDL code to actual integrated circuit designs. The integrated circuit designs can then be fabricated into integrated circuits. Reduction of HDL code to a circuit design is analogous to the reduction (i.e., compiling) of computer program source code to machine language code. EDA processes can "reduce" hundreds or thousands of lines of HDL code to millions of transistor gates and associated interconnections.

EDA tools typically attempt to optimize the design and layout of integrated circuit designs so that the designs meet speed, power, and/or other constraints. EDA processes tend to be extremely complex and consume substantial computational resources. A typical reduction process can take days, weeks, or even months.

What are needed, therefore, are improved methods and systems for electronic design automation.

SUMMARY OF THE INVENTION

The present invention is directed to methods and systems for electronic design automation. In an embodiment, RTL code is converted into objects. The objects are clustered into more manageable numbers of objects. Clustering is optionally performed to reduce the number of interconnections between the clusters. Clustering optionally includes multi-level clustering.

The clusters, and any unclustered objects, are floorplanned. Floorplanning positions the clusters so as to reduce the length of interconnections between the clusters. Objects within the clusters are then placed within the area assigned to the corresponding clusters.

Clustering and/or placement optionally utilizes placement-based wire load models to accurately predict timing issues.

Clustering and/or placement optionally include a bottoms-up procedure, wherein area and/or size constraints of clustered objects are taken into account.

Additional features and advantages of the invention will be set forth in the description that follows. Yet further features and advantages will be apparent to a person skilled in the art based on the description set forth herein or may be learned by practice of the invention. The advantages of the invention will be realized and attained by the structure particularly pointed out in the written description and claims hereof as well as the appended drawings.

It is to be understood that both the foregoing summary and the following detailed description are exemplary and explanatory and are intended to provide further explanation of the invention as claimed.

BRIEF DESCRIPTION OF THE DRAWINGS/FIGURES

The present invention will be described with reference to the accompanying drawings, wherein like reference numbers indicate identical or functionally similar elements. Also, the leftmost digit(s) of the reference numbers identify the drawings in which the associated elements are first introduced.

DETAILED DESCRIPTION OF THE INVENTION

Figure 1:
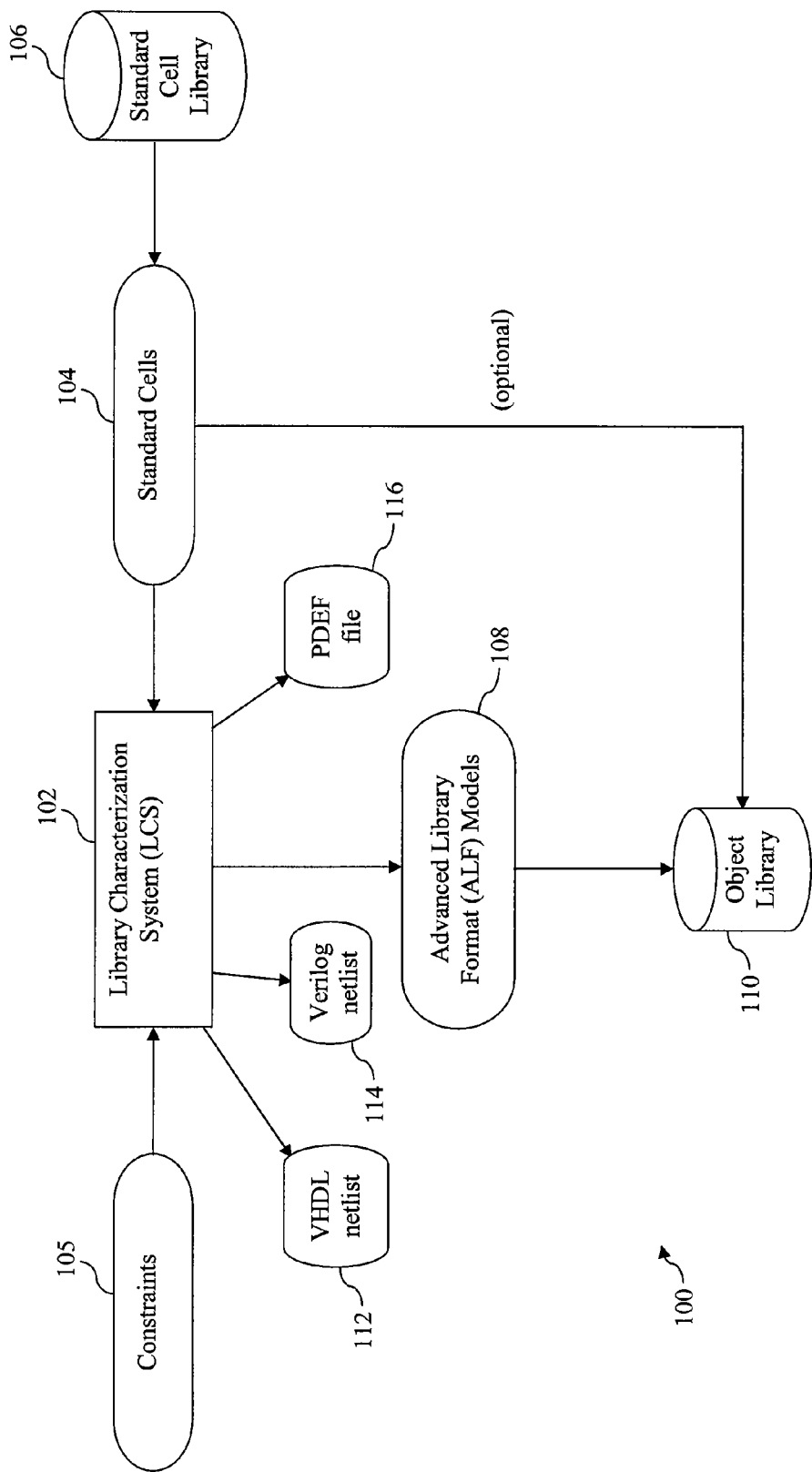
FIG. 1 is an example process flowchart for generating logic objects.

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

I. Integrated Circuit Design Overview

Integrated circuits are designed using computer-based hardware description languages ("HDLs"). Several types of HDL exist, including but not limited to verilog, VHDL, systemC, SystemVerilog, and resistor transistor logic ("RTL"). Although the present application will describe the invention with reference to RTL code, a person of ordinary skill in the art will recognize that any type of logic source code may be used.

EDA tools are typically classified as front-end or back-end tools. Front-end EDA tools typically operate on HDL code and/or abstract representations of functions associated with the HDL code. Conventional front-end EDA tools attempt to optimize the HDL code and/or the abstract representations. For example, synthesis and technology mapping, functional verification, and/or initial timing analyses can be performed.

Conventional front-end EDA tools utilize rough estimates or statistical estimations of characteristics of the eventual integrated circuit design. The characteristics can include timing and/or power consumption. Because of the rough estimates, conventional front-end processes are less than ideal, but can be useful, nevertheless, because they can identify some problems at an early stage.

During back-end processing, the HDL code and/or abstract objects representative of the HDL code are converted to a layout design of the integrated circuit. A typical layout design includes millions of gates and associated interconnections. The back-end processing arranges and re-arranges the gates in an attempt to obtain desired operational characteristics. This is often referred to as a "place and route" operation. Because of the sheer number of gates and interconnections, conventional back-end processing typically takes days to converge on a solution.

In many cases, the initial back-end operation is unable to obtain or converge on a design that meets the design criteria (i.e., desired operational characteristics). For example, the circuit may consume more power than called for, or may have internal gate or wire delays, which prevent proper operation.

When this occurs, designers must revise the HDL code and repeat the front-end and back-end processes. EDA thus tends to be an iterative process, which may take days, weeks, or months to converge on a workable design.

Additional features related to front-end and back-end processing are provided below.

A. Front End: RTL and Synthesis

Integrated circuit designers write desired functionality into RTL code. During front-end design, the RTL code is converted, or synthesized, to a gate-level list ("gate-level netlist") of transistor gates ("gates") and interconnections. Synthesis typically includes optimization of the RTL code, such as by elimination of redundant terms. Synthesis can also revise the structure of the RTL code to improve performance.

Some conventional synthesis tools use models for certain types of logic, such as adders and multipliers. Conventional systems do not, however, utilize the models for placement operations and do not use actual physical information in the models (e.g., actual wire lengths and gate delay information). Thus, gate-level netlists generated by conventional synthesis systems typically require extensive additional optimization and iterations at the back end.

B. Back End: Place and Route

During back-end processing, the gate-level netlist is mapped onto an integrated circuit design. This includes iteratively rearranging the placement of the gates, and iteratively routing and re-routing interconnections so that the circuit meets given timing and power constraints. This typically involves placing the gates so as to minimize routing lengths, congestion, and other factors. Because of the sheer number of gates involved in typical designs, optimization procedures that are executed in the back end are typically very time consuming and computationally demanding. The back-end process also involves the floorplanning of macros, black boxes, and user defined blocks, as well as the placement of I/O pads. This process is typically very difficult, requiring a lot of manual intervention, and is generally not in the skill set of a typical front-end designer.

II. Advanced Optional Processing Features, Abstract Representations of RTL, and Physical Synthesis In order to reduce the work required during back end processing, groups of associated gates are optionally represented as objects. The objects represent functionality encoded by the RTL. Traditional back-end optimization operations, such as, and without limitation, logic optimization, floorplanning, placement, and/or routing operations can be performed on the objects at a high level by the front-end designer. These optimization operations done at a high level of abstraction reduce the work required in the back end and thus reduce the overall time required to convert RTL code to an integrated circuit design.

For example, Tera Systems, Inc., of Campbell, Calif., has developed logic objects (e.g., Tera Systems' TeraGates™), that provide realistic high-level representations of integrated circuit building blocks. Tera Systems, Inc. has also developed a number of processes for optimizing design layouts of objects, including logic objects (e.g., Tera Systems' TeraForm™). The realistic high level representations and associated processes allow for more accurate front end and back end optimizations at a high level of abstraction. As a result, the amount of work performed during back-end processing is significantly reduced.

Logic objects represent RTL code, or portions thereof. Each logic object typically represents multiple gates, sometimes thousands of gates. Logic objects can represent, for example, AND functions, OR functions, and more complex functions such as adders, multipliers, and multiplexers. The logic objects serve as high-level or abstract representations of the integrated circuit design.

An important feature of the logic objects is that they include actual gate level physical information associated with the underlying gates. The physical information can include structural information for the underlying gates, placement-based wire-load models for wires between gates, related placement information for gates included in the model, and actual timing information for the gates. The gate level physical information is obtained from integrated circuit fabrication facilities. Libraries of logic objects can be generated to incorporate various design features that are supported by a fabrication facility.

Inclusion of physical information in the logic objects, including use of placement-based wire-load models, and associated processes, are described in U.S. Pat. Nos. 6,145,117 and 6,360,356B1, and U.S. patent application Ser. No. 10/040,852 (now U.S. Pat. No. 7,143,367), all titled "Creating Optimized Physical Implementations from High-Level Descriptions of Electronic Design," all of which are incorporated herein by reference in their entireties. As indicated in U.S. Pat. No. 6,145,117, a logic object is a technology-independent description of a logic structure that has performance data fully characterizing its performance envelope over a range of different physical implementations, wherein performance data is created by placing and routing each physical implementation to create a placement-based wire load model. A logic object may have multiple implementations representing different area and speed tradeoffs.

In operation, during front-end processing, RTL code, or portions thereof, is automatically converted to logic objects and other optional objects. The objects are then placed and routed during front-end processing.

Advanced front-end operations are performed on hundreds or thousands of logic objects and other types of optional objects, rather than the millions of gates that are operated on during back-end processing. Advanced front-end operations for processing logic objects include floorplanning, place and route operations, which take into account the actual physical information of the underlying circuitry that is represented by the logic objects.

Advanced front-end processing of objects essentially move back-end operations to the front-end. At the same time, the product automates these back-end operations to make the tool usable and accessible to conventional front-end designers, without requiring the years of experience that conventional back-end tools require for effective usage. As a result, design problems are more likely to be identified early on by the actual system designers instead of late in the design flow by the back-end engineering team. In addition, when the advanced front-end process converges on a place and route solution for the objects, the back-end process simply has to place and route gates within the area that was assigned to corresponding logic objects. In other words, there is generally no need for iterative back-end place and route operations to be performed on the overall design. Thus, back-end processing can typically be performed in a single pass.

When the advanced. front-end synthesis process is performed with actual physical information, the synthesis operation is referred to herein as a "physical synthesis" operation. The front-end physical synthesis operation generates a netlist of objects rather than a gate level netlist. The netlist of objects includes gatelist information associated with each object that is needed during back-end processing. Since the objects have been placed during front-end processing, back-end processing can focus on detailed placement of the gates within each object. This substantially reduces the amount of work performed during back-end processing.

The objects optionally include information that maps the objects back to the corresponding RTL code. As a result, debugging of a design, at any level, can be mapped back to the corresponding RTL code.

RTL code can be converted into a variety of types of objects, examples of which are provided below. The invention is not, however, limited to the examples provided herein. Based on the description herein, one skilled in the relevant art(s) will understand that other types of objects can be utilized, and that objects may be of multiple types.

Objects, such as logic objects, allow the RTL code to be represented at a level of abstraction that is above a gate level netlist. The objects can be manipulated during front-end processing using fewer resources (e.g., computational resources and/or manpower resources) than what is required to manipulate corresponding gate level components.

For example, placement operations are optionally performed on the objects. Front-end placement operations provide placement information for the objects. During back-end processing, gates within the abstract objects are placed within the areas assigned to corresponding objects. Front-end operations performed on abstract objects are relatively fast because there are fewer objects to manipulate, compared to the number of gate level components in a netlist. The high-level operations thus reduce the overall time to reduce RTL code into an integrated circuit design.

A. Standard Cell Objects

Some portions of RTL code provide support functions for other features. Support functions can include, without limitation, glue logic, timing logic, control logic, memory logic, interconnection, etc. The term glue logic is used to broadly refer to features such as, and without limitation, buffers and/or interfacing functions. RTL code that provides such supporting functions is optionally represented as objects referred to herein as standard cell objects. A standard cell object may be an abstraction representing one or more transistors or gates, such as AND gates and OR gates.

A standard cell object may include information such as, and without limitation, function(s) performed by the standard cell, area required to implement the standard cell, interconnections with other objects, and/or identification of the line(s) of RTL code that are associated with the standard cell.

B. Logic Objects

Some portions of RTL code are typically directed to more complex logical functions, such as AND operations, OR operations, multiplying operations, multiplexing operations, and sequential (flip-flop, latch) operations. Such RTL code is optionally represented by what is referred to herein as TeraGates™ or logic objects. A logic object is an abstraction that typically represents multiple gates and/or standard cells.

Logic objects include actual gate level physical information associated with the underlying gates, as described above. Logic objects also include information such as, and without limitation, function(s) performed by the logic object, area required to implement the logic object, interconnections with other objects, and/or identification of the line(s) of RTL code that are associated with the logic object.

C. Memory and IP Blocks

A typical integrated circuit design includes one or more memory blocks and/or one or more proprietary blocks. Proprietary blocks are often referred to as intellectual property blocks or IP blocks. Memory blocks and proprietary blocks are optionally represented as objects during front-end processing.

D. Hierarchies

Designers often write RTL code with hierarchies, in which functions are grouped together according to some principle, such as according to an associated engineering group responsible for the code, and/or according to functions performed by the associated code. RTL functional hierarchies, and/or other hierarchies described below, are optionally maintained during synthesis.

In the actual layout of the integrated circuit, it may make more sense to re-group components from one hierarchy to another in order to optimize timing, routing, area, and/or power requirements. In some situations, therefore, functional RTL hierarchy designations are dissolved or ignored, in whole or in part, during front-end and/or back-end processing. The underlying logic encoded in the RTL is not ignored, only the grouping of logic functions.

E. Hard Objects, Pseudo Hard Objects, and Soft Objects

Objects are optionally defined as hard objects, pseudo hard objects, or soft objects. Hard objects have fixed shape constraints. Pseudo hard objects have one or more discrete shape constraints. Soft objects, on the other hand, have no shape constraints.

Standard cell objects, memory, and IP blocks typically have fixed size and/or shape and are thus generally referred to as hard objects. Logic objects and hierarchies typically have variable size and/or area constraints and are thus considered soft objects. Hierarchies (logic functions or clusters) which contain hard and/or pseudo hard objects are considered pseudo hard objects.

III. Example Environment for RTL Processing with Logic Objects

Figure 2:
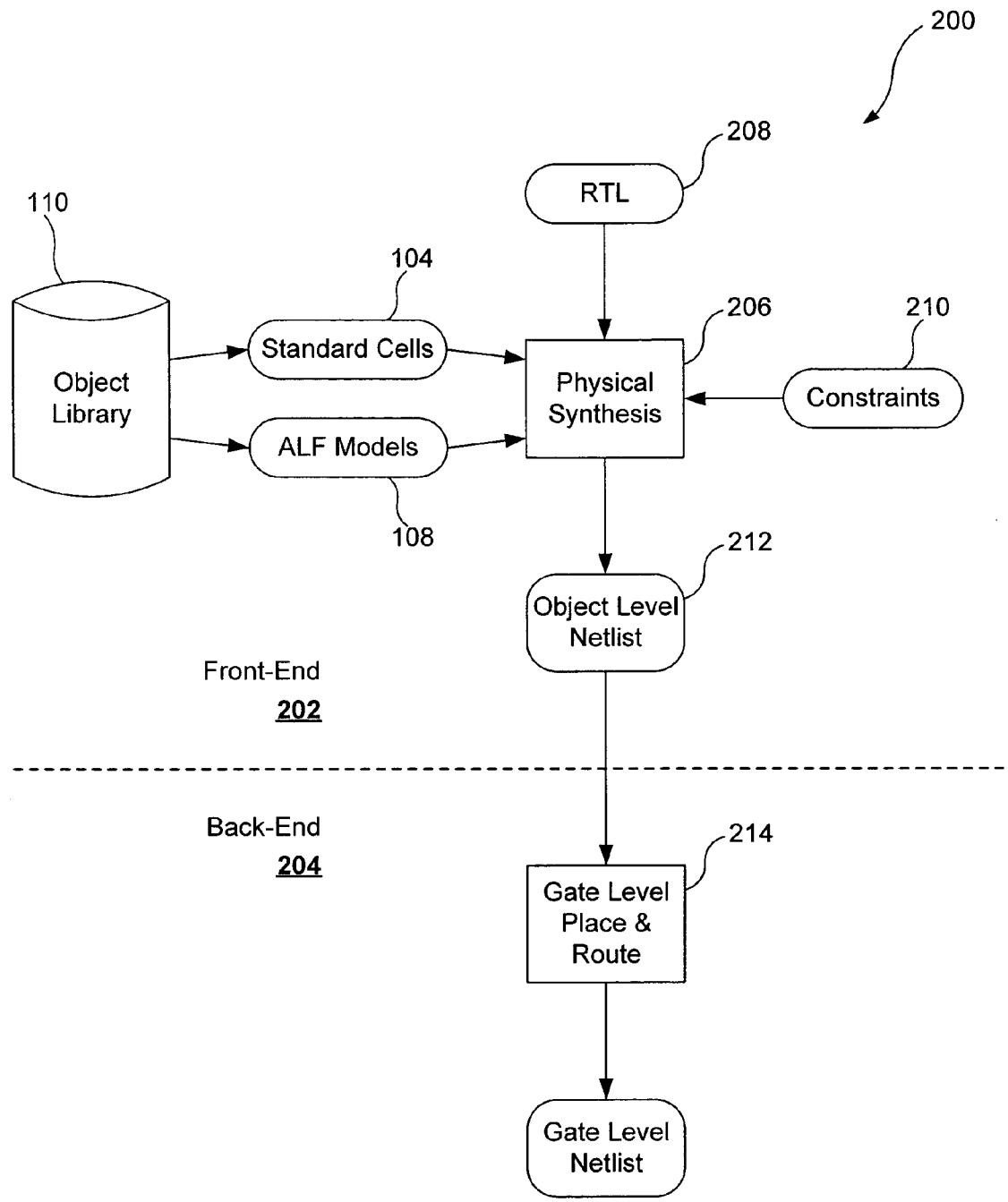
FIG. 2 is an example process flowchart for processing RTL using objects.

FIGS. 1 and 2 are example process flowcharts according to embodiments of the invention for processing RTL using logic objects. The invention is not, however, limited to the examples of FIGS. 1 and 2. Based on the description herein, one skilled in the relevant art(s) will understand that the invention can be implemented with other process flowcharts.

A. Generation of Libraries of Logic Objects

FIG. 1 is a process flowchart 100 for generating logic objects. A library characterization system ("LCS") 102 receives standard cells 104 from a library of standard cells 106. The standard cells 104 typically include a plurality of standard logic cells such as, for example and without limitation, AND cells, OR cells, flip-flops, and the like. The standard cells 104 are optionally obtained from an integrated circuit fabrication facility, wherein the standard cells 104 incorporate process-dependent features of the fabrication facility, including timing, physical area, and power information.

The LCS 102 also receives constraints 105. The constraints 105 include gate level physical information for implementing the standard cells 104. The constraints 105 are typically associated with a fabrication facility and, more particularly, with an implementation technology of the fabrication facility. For example, and without limitation, the constraints 105 are optionally tailored for speed, power consumption, and/or process, voltage, and/or temperature operating ranges.

The LCS 102 generates, from standard cells 104 and in accordance with constraints 105, advanced library format ("ALF") models 108, VHDL netlist 112, Verilog netlist 114, and PDEF file 116. VHDL netlist 112 and Verilog netlist 114 may be used to provide a complete gate-level netlist to back-end tools. This precludes the need to run a separate gate-level synthesis in order to provide a full netlist to the back-end. PDEF file 116 includes relative placement information, which can be used to drive the detailed placement of back-end tools. This improves overall correlation with back-end tools. The ALF models 108 represent, for example and without limitation, one or more of the standard cells 104, and/or more complex logic, such as multipliers, multiplexers, Boolean logic or glue logic, and/or mega functions such as large adders, that are constructed from multiple standard cells 104.

The ALF models 108 include a variety of information such as a listing of physical gates needed to implement the logic object, pin information associated with the gates, interconnection information between the gate pins, bit widths, architecture, constraints used to build the object, detailed timing information, detailed area information, and/or other physical information, such as placement-based wire load models.

The ALF models 108 are stored in an object library 110. The object library 110 optionally includes one or more standard cells 104, with or without physical information.

The library 110 is optionally generated, in whole or in part, in advance of need and/or on-the-fly. The libraries can also contain a description of the relative placement of gates within the object, which can be used to drive downstream back-end implementation tools. Multiple libraries 110 can be generated for different technologies using different sets of constraints 105.

B. Physical Synthesis Using Libraries of Logic Objects

FIG. 2 is a process flowchart 200 for synthesizing RTL code using logic objects. The process flowchart 200 includes a front-end processing section 202 and a back-end processing section 204.

A physical synthesis module 206 receives RTL code 208, ALF or logic object models 108 from object library 110, and constraints 210. The constraints 210 are for the design in process and are not the same as constraints 105 in FIG. 1. The physical synthesis module 206 optionally receives one or more standard cells 104.

The physical synthesis module 206 synthesizes the RTL code 208 using the ALF models 108 and the constraints 210. The physical synthesis module 206 optionally uses one or more standard cells 104. Physical synthesis includes traditional RTL synthesis as well as floorplanning, placement, and/or routing of the objects using physical information associated with the ALF models 108.

During synthesis, the physical synthesis module 206 generates instances of the ALF models 108 (i.e., logic objects) as needed to represent functionality encoded in the RTL 208. Each instance of a logic object retains most, if not all, of the information originally contained within the corresponding ALF model 108.

Each instance of a logic object is populated with an identification of the portion(s) of the RTL code 208 associated with the instance of the logic object. Each instance of the logic object is further populated with interconnection information to other objects. Thus each instance of a logic object includes gate level netlist information, timing and area information, and mapping information to corresponding RTL code. The RTL netlist mapping information allows the objects to be mapped back to the RTL for troubleshooting and/or other purposes.

During physical synthesis, the physical synthesis module 206 optionally performs one or more conventional synthesis operations on the RTL code 208. Since each object represents multiple gates, manipulations of the objects takes considerably less computer processing time than would be required to perform similar manipulations of the individual gates at the back end.

During physical synthesis, the physical synthesis module 206 also optionally performs one or more unconventional synthesis operations on the RTL code 208, such as optimizing stacked logic. Stacked logic can be, for example, a bus of data lines that are ANDed together. Rather than generating a large number of small individual AND gates at the gate level, a single stacked, multiple input AND gate is used. The single stacked AND presents a single object to the tools, substantially improving the runtime and capacity. All of the process operating at this higher level of abstraction take advantage of this more advanced and efficient data model.

The physical synthesis module 206 outputs an object level netlist 212, which includes instances of logic objects generated by the physical synthesis module 206. Each logic object includes associated gate level netlist information. The object level netlist 212 is passed to the back-end process 204, where place and route operations are performed on the gate level netlist information associated with the logic objects. This gate level netlist can be provided, for example, by LCS 102.

IV. Mixed Mode Placement

A. Introduction to Mixed-Mode Placement

During the physical synthesis operation (e.g., 206 in FIG. 2), the objects are placed. Placement of objects is analogous to the place and route operations 214 that are typically performed during the back-end processing 204. Placement of objects means manipulating their physical layout location relative to one another. A typical goal of object placement is to optimize timing considerations. This is accomplished by, among other things, placing of objects to reduce the wire lengths between the objects. Other optimization goals can also be achieved during placement of objects.

In some situations, placement operations are difficult to perform on objects. For example, where the total number of objects is excessive, and/or there are many hard objects, placement operations either consume significant computer resources or generate poor results. In some cases, placement of approximately one to two million objects is manageable, while placement of ten to twenty million objects becomes more difficult.

Accordingly, objects are clustered into a more manageable number of objects. Objects are selected for clusters according to one or more optimization priorities. For example, objects are optionally selected for clusters so as to reduce the number of interconnections between clusters. This helps to, among other things, reduce the computations performed during floorplanning, described below.

Clusters are, essentially, computer-generated hierarchies. Clusters differ from functional hierarchies that are embedded within the RTL in that clusters are optimized to, among other goals, reduce the number of interconnections between the clusters. Functional RTL hierarchies, on the other hand, are typically based on factors other than reduction of interconnections, such as the function performed. Functional RTL hierarchies are rarely optimal for integrated circuit designs.

Clustering optionally considers hierarchies that are embedded within the RTL code. In other words, clustering optionally tracks or copies, in whole or in part, hierarches embedded within the RTL. Weighting is optionally used to allow clustering to track RTL hierarchies so long as it does not adversely impact other optimization priorities.

At any level, if there is one hard or pseudo hard object, a floorplanning operation is called. Floorplanning is generally defined as positioning and shaping objects, such as clusters, relative to one another in the design layout. Floorplanning is typically used for high level design planning. Floorplanning can handle various sized hard and/or soft objects well. However, as the total number of objects increases, the requirement of computer resource increases significantly. Floorplanning is distinguishable from back-end placement in that back-end placement operates on pure hard objects to position them at locations that follow design rules for a particular fabrication facility. Typically, placement procedures are designed to handle many similar sized objects such as, for example, standard cells. If there are too many hard objects, such as memory blocks or IP blocks, placement operations tend to fail or give poor results Floorplanning, on the other hand, positions clusters relative to one another and determines the shape of clusters to optimize one or more global features. For example, and without limitation, floorplanning positions objects relative to one another so as to reduce delay between the clusters. This is optionally performed with wire load models described above.

A cluster does not necessarily have a fixed shape and/or area. Thus, During floorplanning, the size and/or shape of the clusters is varied to accommodate various attempts to floorplan the objects. The shape and/or size of a cluster can be varied within constraints imposed by objects within the cluster. For example, when floorplanning a cluster that includes a hard object, the hard object may impose constraints on the size and/or shape of the cluster. Thus, during floorplanning, the fixed area and/or shape of the hard object is considered when determining the area and/or shape of a cluster. This is referred to herein as a bottoms-up procedure. The floorplanning procedure, in combination with the placement procedures described throughout, are collectively referred to herein as mixed-mode physical synthesis.

After floorplanning, objects within the clusters are examined. For each cluster, if there exists one or more hard or pseudo hard objects, floorplanning is applied to the cluster. Otherwise, a placement procedure is invoked and all soft objects are placed within the respective areas that are assigned to the clusters during floorplanning.

Clusters optionally include multi-level clusters, or clusters within clusters. When a cluster includes one or more underlying clusters ("sub-clusters") the underlying clusters are optionally floorplanned relative to one another, within the area assigned to the corresponding original cluster. In other words, when a cluster includes a hierarchy of clusters, floorplanning and placement operations are performed iteratively until all of the underlying objects are placed.

The operations described above can be performed on a variety of types of objects, and combinations thereof, including, without limitation, standard cell objects, logic objects, memory blocks, and proprietary blocks.

The invention can be implemented with application specific integrated circuits ("ASICs").

Example implementations are described below. The invention is not, however, limited to the example implementations described herein. Based on the description herein, one skilled in the relevant art(s) will understand that the invention can be implemented with other types of objects, and combinations thereof.

Figure 4:
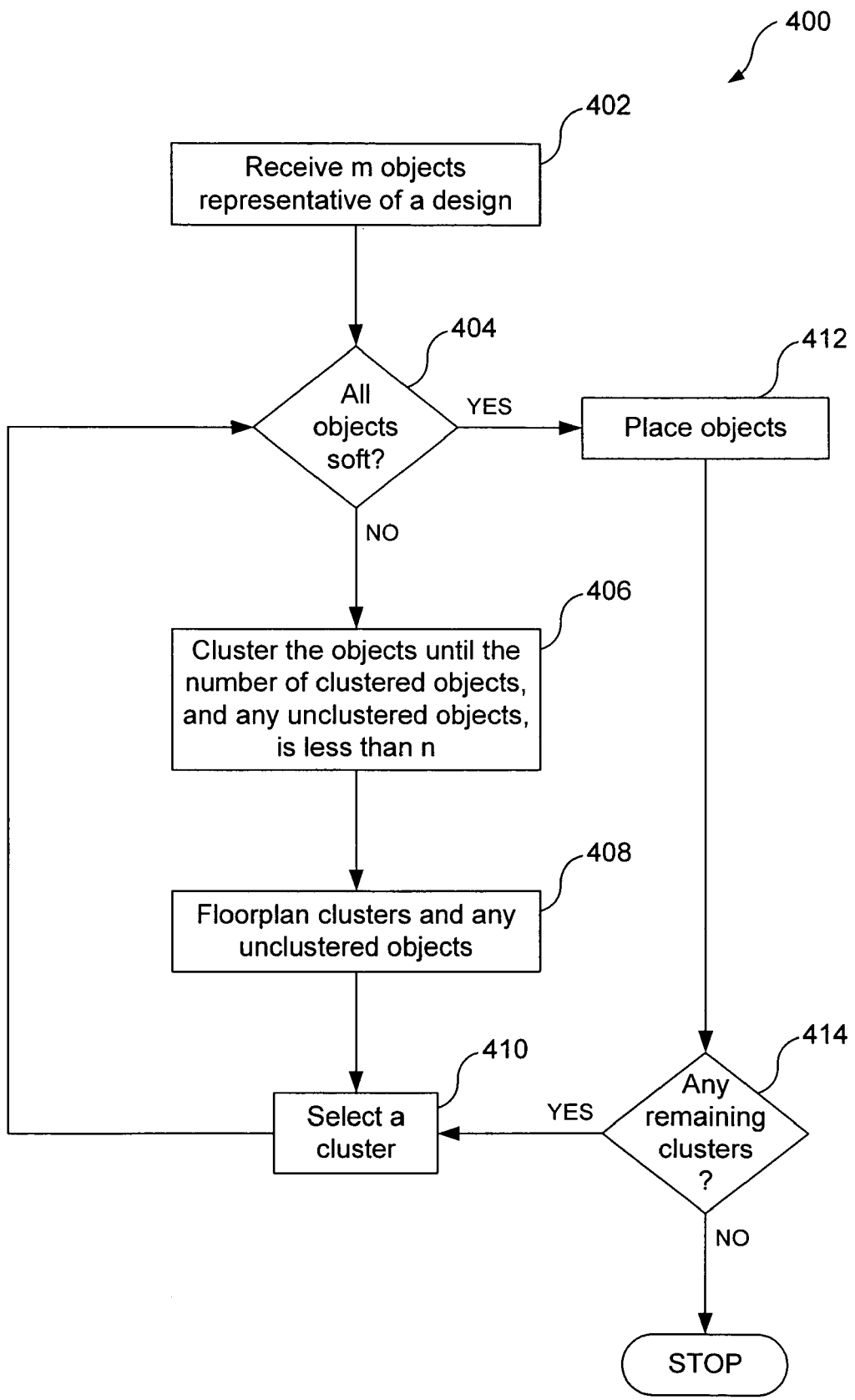
FIG. 4 is a flowchart of an example process 400 for clustering, floorplanning, and placing the objects 300 during front-end synthesis.

B. Example Implementation of Floorplanning and Placement During Physical Synthesis FIG. 4 is a flowchart of an example process 400 for clustering, floorplanning, and placing objects, including logic objects, during front-end physical synthesis.

Figure 3:
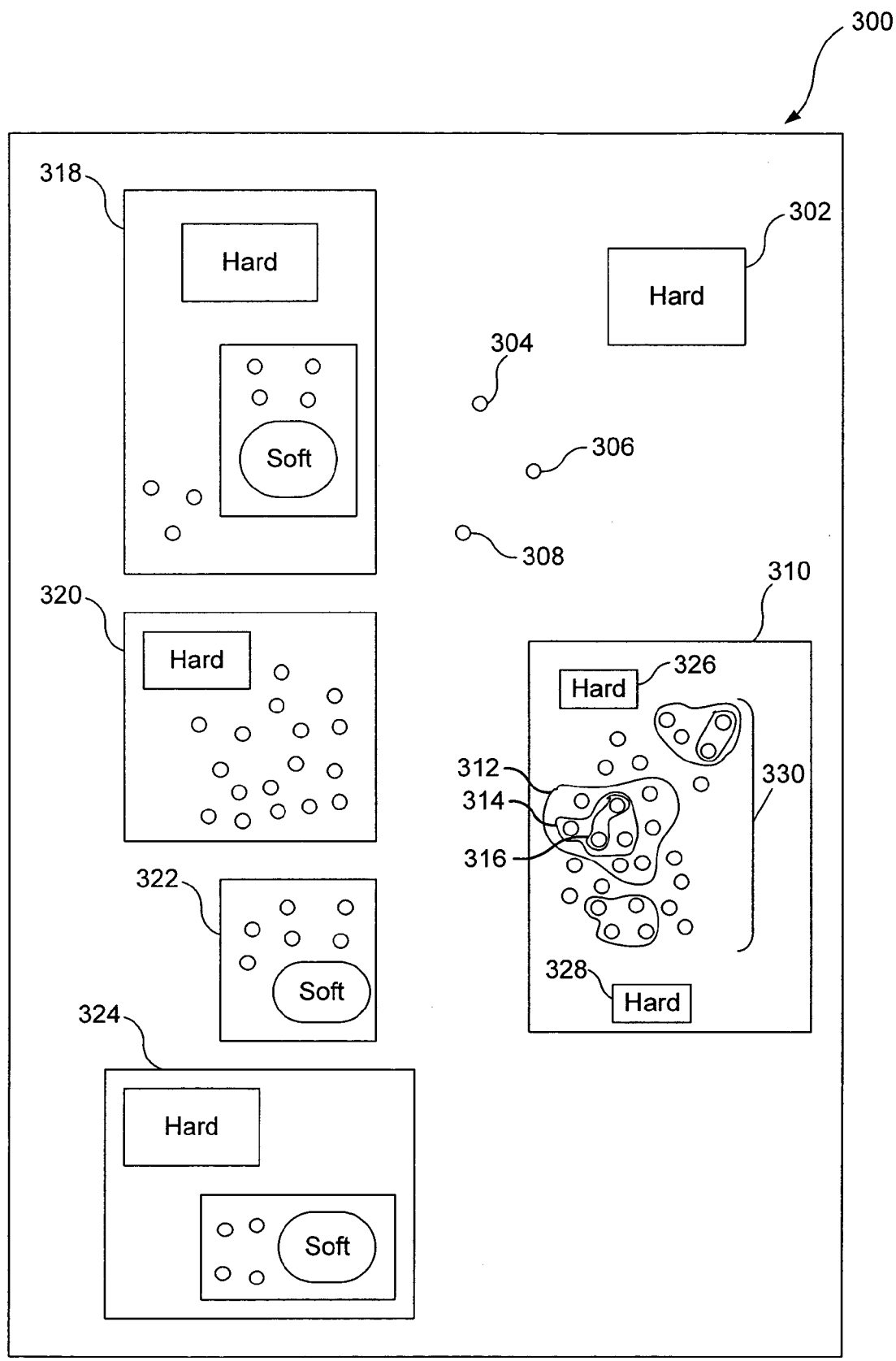
FIG. 3 is an example illustration of m objects 300 representative of RTL 208.

FIG. 3 is an example illustration of m objects 300 representative of RTL 208, where m is an integer. In a typical design layout, there are between hundreds and thousands of m objects 300. Optionally, the m objects 300, or a portion of the m objects 300, include logic objects that include detailed physical information, as described above.

The example process 400 is described below with respect to the m objects 300. The example process 400 is not, however, limited to the m objects 300. Based on the description herein, one skilled in the relevant art(s) will understand that the process 400 can be implemented with other objects.

In order to place the m objects 300 in a design layout, the m objects 300 are analyzed. If there exists at least one hard or pseudo hard object, the m objects 300 are clustered or partitioned to a more manageable number, and the clusters or partitions are floorplanned. Otherwise, all objects are placed via placement operation. After floorplanning, each cluster is examined to see if further floorplanning is needed. If all the objects within the cluster are soft objects, placement operation applies. The process will be called recursively until all objects are placed. The result is an object-level netlist that is provided to a back-end process for detailed place and route operations. The detailed back-end place and route operations are focused on detailed placing of gates within the areas assigned to their corresponding objects.

The example process 400 begins at step 402, which includes receiving or accessing m objects representative of source code for an integrated circuit design. The objects will typically include hard, pseudo hard and soft objects. Hard objects include one or more of hard macros, standard cells, and proprietary blocks. Soft objects include one or more of glue logic or soft macros (e.g., cells having hierarchical features). Pseudo hard objects are hierarchies which contain hard or other pseudo hard objects.

Step 404 examines all objects of a current problem. For example, in a first instance, step 404 examines the m objects received in step 402. In subsequent instances, step 404 examines objects within selected clusters. If all of the examined objects are soft objects, processing proceeds to step 412, where the objects are placed. This path is described below. Referring back to step 404, if all of the examined objects are not soft objects, processing proceeds to step 406.

Step 406 includes clustering the objects until the combined number of clustered and unclustered objects is less than n objects, wherein n is a maximum desired number of objects for a floorplanning operation. In an embodiment, n is approximately 100. It is contemplated that n will increase with advancements in computational abilities.

Not all objects are required to be clustered. For example, and without limitation, relatively large, and/or hard objects, such as memory blocks and IP blocks, are optionally not clustered. In the example of FIG. 3, a hard object 302 is not clustered. Also, several instances of glue logic 304, 306, and 308 are not clustered.

The clustering of step 406 includes selecting objects for the clustering so as to reduce or minimize the number of interconnections between the clusters. This helps to reduce communications between clusters or partitions. In other words, objects that communicate with one another are more likely to be clustered together. The clustering optionally includes clustering objects of similar size.

The clustering optionally includes multiple iterations of clustering until the desired number of objects is obtained. Multiple iterations of clustering results in multi-level clustering. For example, a first iteration of clustering generates a first level of clusters. One or more subsequent iterations of clustering results in clustering of clusters within clusters. This is repeated until the total number of clusters, and any unclustered objects, is reduced to less than n. For example, a first clustering iteration may result in hundreds or thousands of clusters. Subsequent clustering iterations are performed until the number of clusters is near or below n.

In the example of FIG. 3, a cluster 310 includes a cluster 312, which includes a cluster 314, which includes a cluster 312.

Processing then proceeds to step 408, which includes floorplanning the clusters, or partitions, in a design area. In the event that one or more of the original m objects are not included in a cluster, the unclustered object(s) are optionally floorplanned with the clusters.

During floorplanning, the clusters are positioned and shaped within the design area so as to reduce wire lengths between the clusters. Optionally, floorplanning also seeks to position the clusters so as to reduce or minimize the size of the design area.

Floorplanning includes determining potential shape, locations, and intercommunications between objects (clustered and any unclustered objects). Floorplanning typically requires massive computations. Reducing the number of objects being floorplanned (i.e., clustering), reduces the floorplanning computations. Considering conventional RTL code and conventional processing considerations, it has been found that floorplanning generally works well with conventional computers with approximately 100 clusters. Thus, clustering is performed to reduce the number of clusters on a given level to approximately 100 or fewer clusters. It is anticipated that advancements in computer processing capabilities will lead to an increase in the number of objects that can be floorplanned.

In the example of FIG. 3, floorplanning results in the placement of clusters 302, 310, 318, 320, 322, and 324, substantially as illustrated.

During floorplanning, a bottoms-up analysis is performed to identify any placement constraints, such as size and/or shape limitations of clusters. For example, objects within a cluster are analyzed to identify any size and/or shape limitations. Each possible footprint of a cluster is optionally enumerated. Each possible footprint is optionally analyzed to select an optimum footprint for floorplanning.

For example, in FIG. 3, a footprint of cluster 310 will be based on any size and/or shape limitations associated with hard objects 326 and 328. Cluster 310 is a pseudo hard object. Similarly, object 318, 320, 324 are also pseudo hard objects- Size and/or shape limitations are typically included with information associated with the objects 300.

Processing proceeds to step 410, which includes selecting a cluster. Processing then returns to step 404, which examines the objects within the selected cluster. If all of the objects within the selected cluster are soft, processing proceeds to step 412, where the objects within the selected cluster are placed. This path is described below. Referring back to step 404, if all of the examined objects in the selected cluster are not soft objects, processing proceeds to step 406 as described above. This processes is repeated until all of the objects have been placed in step 412.

Referring to step 412, objects are placed within the design area assigned to the corresponding clusters so as to reduce or minimize the wire lengths between the objects.

Placement analysis is performed on the placeable objects within each group. For example, when objects within a cluster are all soft objects, any hierarchies (i.e., any clusters within the cluster) are flattened, and the objects are placed.

For any hard or pseudo hard objects inside hierarchies, floorplaning and placement is applied recursively. In other words, for multi-level clusters, floorplanning and placement is iteratively performed on clusters within clusters.

After placement in step 412, processing proceeds to decision step 414. If there are any remaining clusters, processing proceeds to step 410 for selection of a cluster, as described above. When there are no remaining clusters, processing stops.

At the conclusion of process 400, a list of the objects (e.g., an object netlist) and their assigned locations is generated. The output list is optionally provided to a back-end electronic design automation tool that places the integrated circuits represented by the objects within the placement area of the corresponding objects.

The invention is optionally implemented with gate level net list information.

The invention is optionally implemented with application specific integrated circuits ("ASICs").

CONCLUSIONS

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A computer implemented method of designing integrated circuits, comprising:

assessing m objects representative of source code for an integrated circuit design, wherein at least a portion of the m objects includes one or more logic objects, each logic object having placement-based performance data characterizing the logic object over a range of different physical implementations, wherein the performance data is created by placing and routing each physical implementation of the logic object;

recursively clustering at least a portion of the assessed m objects until the combined number of clustered and unclustered objects is less than n objects, wherein n is a maximum desired number of objects for a floorplanning operation, wherein the clustering includes selecting objects for the clustering so as to reduce the number of interconnections between the clusters;

floorplanning the less than n objects in a design area, including positioning the less than n objects within the design area so as to reduce wire lengths between the less than n objects, wherein the one or more logic objects are floorplanned using the placement-based performance data;

placing the objects within the design area assigned to the corresponding clusters so as to reduce the wire lengths between the objects; and outputting a list of the objects and their assigned locations.

2. The method according to claim 1, wherein the floorplanning step comprises determining size and shape constraints of objects within the clusters.

3. The method according to claim 2, wherein the floorplanning step further comprises enumerating possible shapes of soft objects within the clusters.

4. The method according to claim 1, further comprising, iteratively floorplanning and placing clusters within a multi-level cluster.

5. The method according to claim 1, wherein the m objects include hard objects having a fixed shape, pseudo hard objects having one or more discrete fixed shape constraints, and soft objects having adjustable shape.

6. The method according to claim 5, wherein the hard objects include logic objects having placement-based performance data that represent integrated circuit building blocks.

7. The method according to claim 6, wherein the placement-based performance data includes placement-based wire load models, gate delay, and pin information, and links between components and corresponding source code.

8. The method according to claim 7, wherein the hard objects further include memory blocks and proprietary objects.

9. The method according to claim 8, wherein the soft objects include clusters of hard objects.

10. The method according to claim 8, wherein the soft objects include clusters of hard objects and soft objects.

11. The method according to claim 10, wherein the clustering comprises determining size constraints of objects within the clusters.

12. The method according to claim 11, wherein the clustering further comprises clustering objects of similar size.

13. The method according to claim 11, wherein the floorplanning step comprises determining size and shape constraints of clustered objects.

14. The method according to claim 1, wherein the floorplanning step comprises utilizing placement-based wire load models to position the less than n objects within the design area so as to minimize wire lengths between the less than n objects.

15. The method according to claim 1, wherein the clustering includes selecting objects for the clustering so as to minimize the number of interconnections between the clusters.

16. The method according to claim 1, wherein the placing step comprises placing the objects within the design area assigned to the corresponding clusters so as to minimize the wire lengths between the objects.

17. The method according to claim 1, wherein the accessing step comprises receiving the m objects.

18. The method according to claim 1, whereby the outputted list of objects is provided to a back-end electronic design automation tool that places the integrated circuits represented by the objects within the placement area of the corresponding objects.

19. A computer program product comprising a computer readable medium having control logic stored therein for causing a computer to design integrated circuits, said control logic comprising:

first computer readable program code for causing the computer to assess m objects representative of source code for an integrated circuit design, wherein at least a portion of the m objects includes one or more logic objects, each logic object having placement-based performance data characterizing the logic object over a range of different physical implementations, wherein the performance data is created by placing and routing each physical implementation of the logic object;

second computer readable program code for causing the computer to recursively cluster at least a portion of the assessed m objects until the combined number of clustered and unclustered objects is less than n objects, wherein n is a maximum desired number of objects for a floorplanning operation, wherein the clustering includes selecting objects for the clustering so as to reduce the number of interconnections between the clusters;

third computer readable program code for causing the computer to floorplan the less than n objects in a design area, including positioning the less than n objects within the design area so as to reduce wire lengths between the less than n objects, wherein the one or more logic objects are floorplanned using the placement-based performance data;

fourth computer readable program code for causing the computer to place the objects within the design area assigned to the corresponding clusters so as to reduce the wire lengths between the objects; and fifth computer readable program code for causing the computer to output a list of the objects and their assigned locations.

20. The computer program product according to claim 19, wherein the m objects assessed by the first computer readable program code include hard objects having a fixed shape, pseudo hard objects having one or more discrete fixed shape constraints, and soft objects having adjustable shape, and wherein the hard objects include logic objects having placement-based performance data that represent integrated circuit building blocks.

* * * * *